United States Patent
Xie et al.

(10) Patent No.: US 12,107,132 B2
(45) Date of Patent: Oct. 1, 2024

(54) SOURCE/DRAIN CONTACT POSITIONING UNDER POWER RAIL

(71) Applicant: International Business Machines Corporation, Armonk, NY (US)

(72) Inventors: Ruilong Xie, Niskayuna, NY (US); Indira Seshadri, Niskayuna, NY (US); Eric Miller, Watervliet, NY (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 113 days.

(21) Appl. No.: 17/491,408

(22) Filed: Sep. 30, 2021

(65) Prior Publication Data
US 2023/0095508 A1   Mar. 30, 2023

(51) Int. Cl.
| | | |
|---|---|---|
| *H01L 29/417* | (2006.01) | |
| *H01L 21/8234* | (2006.01) | |
| *H01L 23/528* | (2006.01) | |
| *H01L 27/088* | (2006.01) | |
| *H01L 27/092* | (2006.01) | |

(Continued)

(52) U.S. Cl.
CPC ............ *H01L 29/41775* (2013.01); *H01L 21/823475* (2013.01); *H01L 23/5286* (2013.01); *H01L 27/088* (2013.01); *H01L 27/0922* (2013.01); *H01L 29/401* (2013.01); *H01L 29/41725* (2013.01); *H01L 29/42392* (2013.01); *H01L 29/78696* (2013.01)

(58) Field of Classification Search
CPC ..... H01L 21/823475; H01L 21/823481; H01L 21/76897; H01L 29/41775; H01L 29/0673; H01L 29/42392; H01L 29/775; H01L 29/66439; H01L 29/78696; H01L 23/5286; H01L 27/088; H01L 27/0922
See application file for complete search history.

(56) References Cited

U.S. PATENT DOCUMENTS

| | | |
|---|---|---|
| 8,975,712 B2 | 3/2015 | Rashed |
| 8,987,816 B2 | 3/2015 | Stephens |

(Continued)

FOREIGN PATENT DOCUMENTS

| | | |
|---|---|---|
| CN | 113380794 A | 9/2021 |
| WO | 2013095548 A1 | 6/2013 |

OTHER PUBLICATIONS

Lee et al., "Ultra High Density Logic Designs Using Transistor-Level Monolithic 3D Integration," IEEE/ACM International Conference on Computer-Aided Design (ICCAD), Nov. 5-8, 2012, San Jose, California, 8 pages.

(Continued)

*Primary Examiner* — Michael M Trinh
(74) *Attorney, Agent, or Firm* — Gavin Giraud

(57) ABSTRACT

Embodiments disclosed herein include a semiconductor structure for reducing contact to contact shorting. The semiconductor structure may include a gate cut region with a liner and a dielectric core confined within a first lateral side of the liner and a second lateral side of the liner. The semiconductor structure may also include a first source/drain (S/D) contact overlapping the first lateral side and the dielectric core. The first S/D may include a line-end that contacts the second lateral side of the liner.

15 Claims, 16 Drawing Sheets

(51) Int. Cl.
  *H01L 29/40*   (2006.01)
  *H01L 29/423*  (2006.01)
  *H01L 29/786*  (2006.01)

(56) References Cited

U.S. PATENT DOCUMENTS

| | | | |
|---|---|---|---|
| 9,461,143 | B2 | 10/2016 | Pethe |
| 10,269,787 | B2 | 4/2019 | Wang |
| 10,319,581 | B1 | 6/2019 | Wen |
| 10,529,833 | B2 | 1/2020 | Ching |
| 10,692,720 | B2 | 6/2020 | Huang |
| 10,998,314 | B2 | 5/2021 | Bergendahl |
| 2009/0166745 | A1* | 7/2009 | Takeuchi ............... H10B 99/00 257/E27.06 |
| 2017/0162568 | A1* | 6/2017 | Song .................... H01L 29/785 |
| 2018/0069000 | A1* | 3/2018 | Bergendahl ........... H01L 29/785 |
| 2019/0067131 | A1* | 2/2019 | Liaw ............... H01L 21/823814 |
| 2019/0259670 | A1 | 8/2019 | Zhuang |
| 2019/0363085 | A1* | 11/2019 | Oh ................. H01L 21/823431 |
| 2020/0006075 | A1 | 1/2020 | Wang |
| 2020/0135575 | A1 | 4/2020 | Greene |
| 2021/0111028 | A1* | 4/2021 | Xie .................. H01L 29/66545 |
| 2021/0193683 | A1* | 6/2021 | Yang ........................ G11C 5/06 |
| 2021/0226023 | A1 | 7/2021 | Huang |
| 2021/0343713 | A1* | 11/2021 | Ju ..................... H01L 29/42392 |

OTHER PUBLICATIONS

International Searching Authority, "Notification of Transmittal of the International Search Report and the Written Opinion of the International Searching Authority, or the Declaration", International application No. PCT/EP2022/075844, International Filing Date Sep. 16, 2022, Mailed on Jan. 16, 2023, 13 pages.

* cited by examiner

SOURCE/DRAIN CONTACT POSITIONING UNDER POWER RAIL

BACKGROUND

The present invention relates generally to the field of semiconductor device manufacturing, and more particularly to fabricating a semiconductor structure with a consistent and accurate location for source/drain contacts.

The fabrication of advanced integrated circuits typically involves forming many circuit elements in a chip area. Metal oxide field effect transistors (MOSFETs or FETs) represent one important type of circuit element that has become ubiquitous in these advanced integrated circuits. A FET is a device that typically includes a source/drain regions, a channel region that is positioned between the source region and the drain region, and a gate electrode positioned above the channel region. Semiconductor nanosheets are seen as a feasible option for reducing the gate length in semiconductor devices. Vertically stacked semiconductor nanosheets provide area efficiency and can provide increased drive current within a given layout.

SUMMARY

Aspects of an embodiment of the present invention include a semiconductor structure for reducing contact to contact shorting. The semiconductor structure may include a gate cut region with a liner and a dielectric core confined within a first lateral side of the liner and a second lateral side of the liner. The semiconductor structure may also include a first source/drain (S/D) contact overlapping the first lateral side and the dielectric core. The first S/D may include a line-end that contacts the second lateral side of the liner.

Aspects of an embodiment of the present invention include methods of fabricating a semiconductor structure. The method may include forming a gate cut, lining the gate cut with a liner comprising a first lateral side and a second lateral side, forming a dielectric core between the first lateral side and the second lateral side, cutting a source/drain contact region through the first lateral side and at least partially into the dielectric core, selectively etching the dielectric core to remove the dielectric core cleanly from the liner on the second lateral side, and forming a source/drain contact within the source/drain contact region, wherein a line-end contacts the second lateral side.

Aspects of an embodiment of the present invention include a semiconductor structure with a first source/drain (S/D) contact electrically connected between a first source/drain (S/D) and a power rail. The semiconductor structure may also include a second S/D contact electrically connected between a second S/D and a signal rail and a gate cut region between the first S/D contact and the second S/D contact. The gate cut region may include a liner and a dielectric core.

BRIEF DESCRIPTION OF THE DRAWINGS

FIG. 1A depicts a top down view of the semiconductor structure 100, with FIGS. 1B, 1C, and 1D depicting cross-sectional side views at the locations indicated in FIG. 1A.

FIG. 2A depicts a top down view of the semiconductor structure 100, with FIGS. 2B, 2C, and 2D depicting cross-sectional side views at the locations indicated in FIG. 2A.

FIG. 3A depicts a top down view of the semiconductor structure 100, with FIGS. 3B, 3C, and 3D depicting cross-sectional side views at the locations indicated in FIG. 3A.

FIG. 4A depicts a top down view of the semiconductor structure 100, with FIGS. 4B, 4C, and 4D depicting cross-sectional side views at the locations indicated in FIG. 4A.

FIG. 5A depicts a top down view of the semiconductor structure 100, with FIGS. 5B, 5C, and 5D depicting cross-sectional side views at the locations indicated in FIG. 5A.

FIG. 6A depicts a top down view of the semiconductor structure 100, with FIGS. 6B, 6C, and 6D depicting cross-sectional side views at the locations indicated in FIG. 6A.

FIG. 7A depicts a top down view of the semiconductor structure 100, with FIGS. 7B, 7C, and 7D depicting cross-sectional side views at the locations indicated in FIG. 7A.

FIG. 8A depicts a top down view of the semiconductor structure 100, with FIGS. 8B, 8C, and 8D depicting cross-sectional side views at the locations indicated in FIG. 8A.

DETAILED DESCRIPTION

In the following detailed description, reference is made to the accompanying drawings, which show specific examples of embodiments of the invention. These embodiments are described in sufficient detail to enable those skilled in the art to practice them, and it is to be understood that other embodiments may be utilized, and that structural, logical and electrical changes may be made without departing from the described embodiments. The following detailed description is, therefore, not to be taken in a limiting sense, and the included embodiments are defined by the appended claims.

With regard to the fabrication of transistors and integrated circuits, major surface refers to that surface of the semiconductor layer in and about which a plurality of transistors are fabricated, e.g., in a planar process. As used herein, terms such as "above," "below," "under," and "over" that have a vertical connotation mean substantially orthogonal with respect to the major surface, while terms such as "laterally," "adjacent," and "beside," that have a horizontal connotation mean substantially parallel to the major surface. Typically, the major surface is along a plane of a monocrystalline silicon layer on which transistor devices are fabricated.

As cell height and back-end-of-line (BEOL) metal pitch scales smaller, wiring source/drain epi of a device to power rails becomes challenging. A source/drain (S/D) contact with extended size is required to form a robust via-to-S/D contact connection under the power rail. However, S/D contact with extended size could cause narrower contact tip-to-tip space at cell boundaries, and with litho misalignment errors, this would lead to contact tip-to-tip shorts. This invention teaches a unique method and structure to accurately control the S/D contact position under the power rail region (at cell boundaries) to ensure good S/D contact to via connection without contact tip-to-tip shorts.

Improvements in the design of transistor devices have enabled feature sizes to enter into deep submicron and nanometer regime. These smaller feature sizes, however, can cause otherwise minor issues to have more detrimental effect on the operation of the transistor device. For example, shorting (i.e., unintended electric flow) and weak bonding with a via can result when the dimensions of a semiconductor component, such as a source/drain (S/D) contact, are not perfectly aligned in the design and fabrication of the semiconductor device. This may be a particularly difficult problem for S/D contacts connecting to power rail vias since the power rail via can be located closer to an adjacent signal via than the signal vias are to each other. Therefore, the embodiments disclosed herein provide a gate cut region with a liner and a dielectric core that provides self-aligning during formation of S/D contacts, and insulation during operation of S/D contacts that connect to power rails.

Figure 1A:
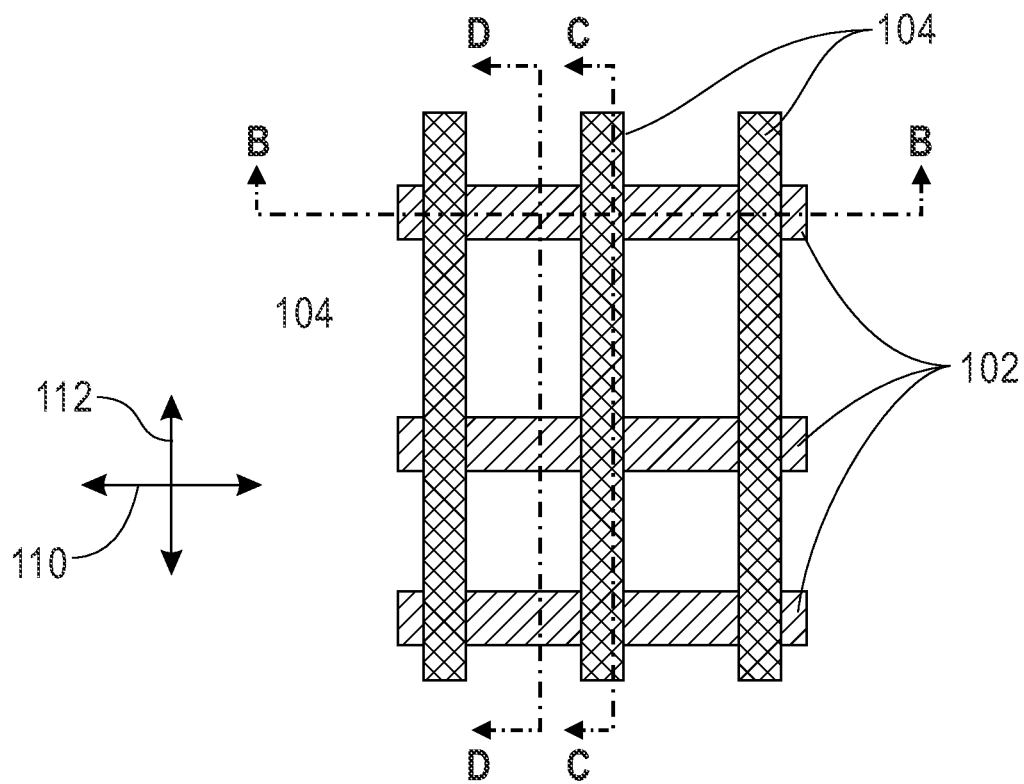
FIGS. 1A, 1B, 1C, and 1D depict the semiconductor structure 100 at a fabrication stage of the processing method, in accordance with one embodiment of the present invention.
Figure 1B:
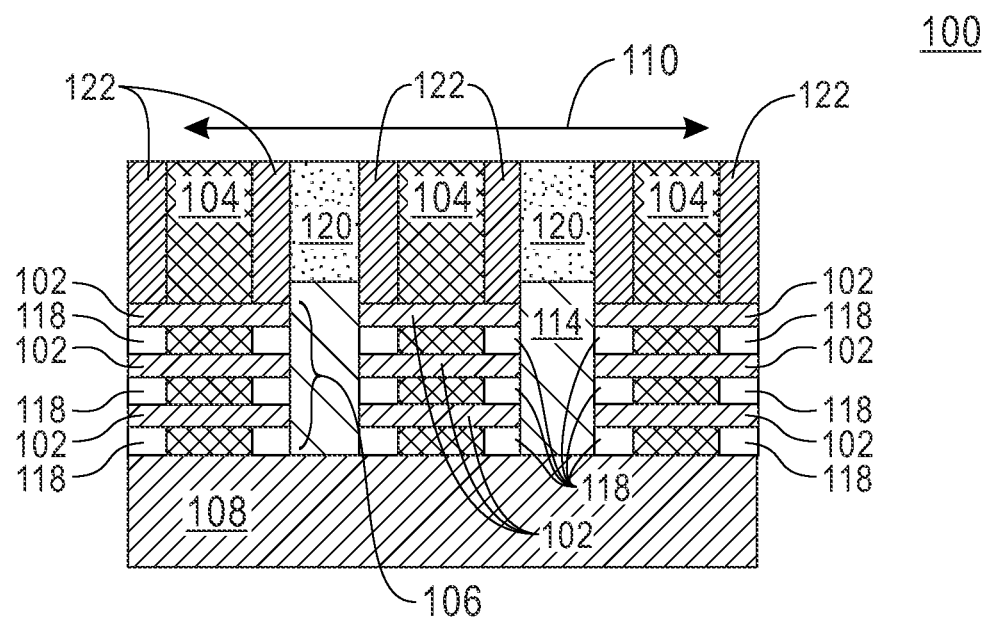
Figure 1C:
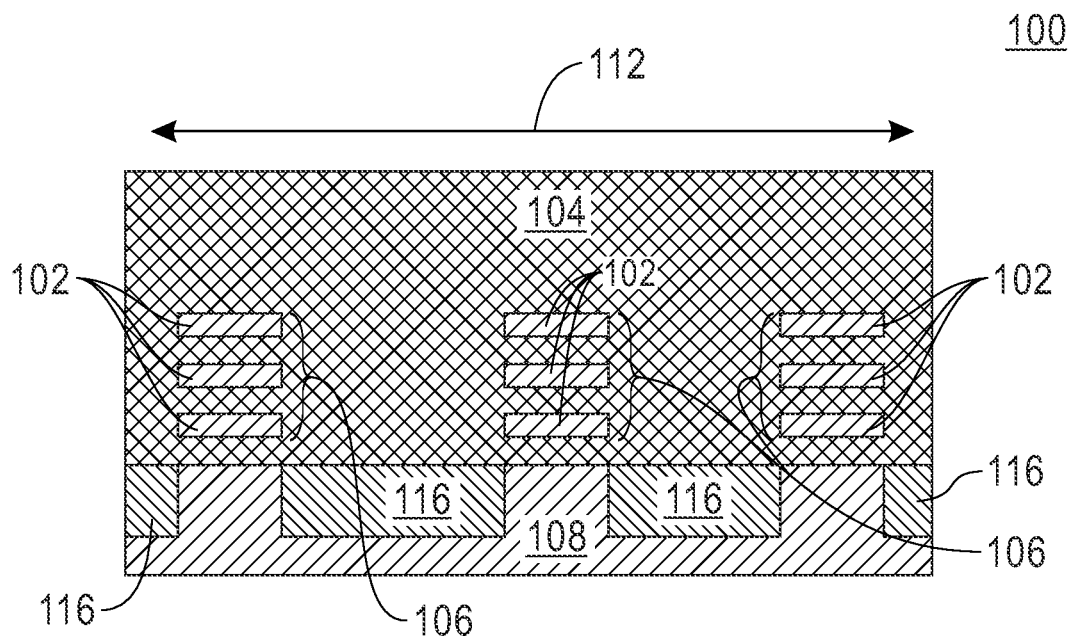
Figure 1D:
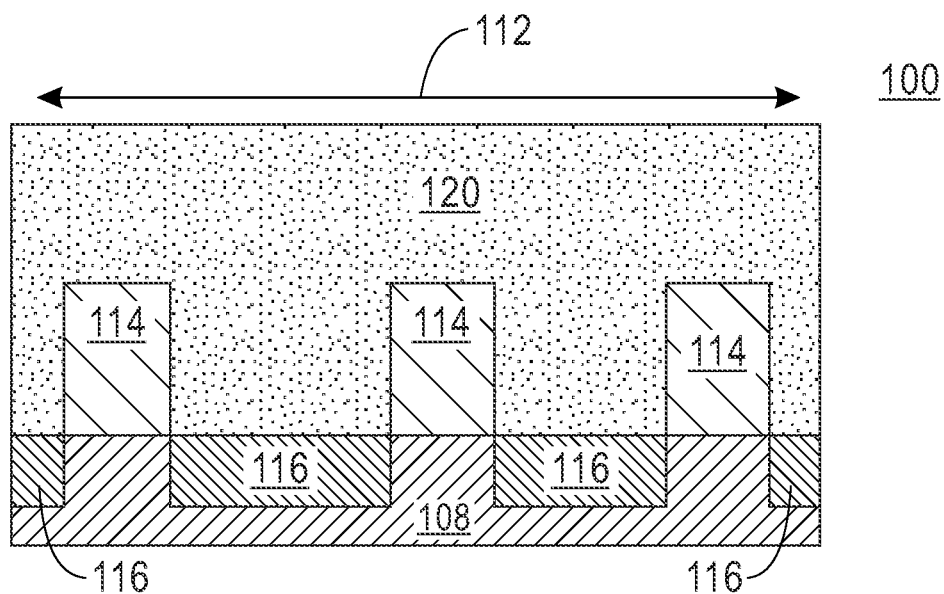

Turning now to the figures, FIGS. 1A, 1B, 1C, and 1D depict a semiconductor structure 100 at a fabrication stage of the processing method, in accordance with one embodiment of the present invention. The illustrated embodiments show the semiconductor structure 100 as a nanosheet device, but in certain embodiments the semiconductor structure 100 described below may be used to connect source/drains and power rails in a variety of types of transistors, including FinFET, nanowire, planar transistor, or others. FIG. 1A depicts a top down view of the semiconductor structure 100, with FIGS. 1B, 1C, and 1D depicting cross-sectional side views at the locations indicated in FIG. 1A: FIG. 1B is the view at line B-B, FIG. 1C is the view at line C-C, and FIG. 1D is the view at line D-D. FIG. 1A does not illustrate all features, but is included mainly to show the grid pattern of rows of active nanosheets 102 and columns of high-k metal gate (HKMG) 104 structures.

As shown in the side views (1B, 1C, 1D), the nanosheets 102 and HKMG 104 are formed in an alternating series as a vertical layer stack 106 on a substrate 108. The stacks 106 are divided from one another in an x-direction 110 by source/drains (S/D) 114, and divided from one another in a y-direction 112 by shallow trench isolation (STI) 116. The stacks 106 also include inner spacer 118 to insulate the nanosheets 102 from each other, and insulate the S/Ds 114 from the HKMG 104. Furthermore, in regions above the S/Ds 114, the semiconductor structure 100 includes interlayer dielectric (ILD) 120 and spacers 122 to isolate the conductive and semiconductive structures. The nanosheets 102, HKMG 104, S/Ds 114, and spacers 118, 122 may be formed by known methods of deposition, patterning, and etching. For example, the nanosheets 102 may be formed using epitaxial growth followed by nanosheet patterning processes, while the S/Ds 114 may be formed by in-situ doped epitaxially growth or by ion implantation. The S/Ds 114 may be n-type or p-type doped (i.e., PFET source/drain or NFET source/drain)

The substrate 108 may include a monocrystalline silicon structure with the shallow trench isolation (STI) 116. Alternatively, the substrate 108 may include a starting wafer having a semiconductor-on-insulator (SOI) substrate, in which STI is not needed. The nanosheets 102 may also be composed of a semiconductor material, such as silicon (Si). The HKMG 104 may include materials with dielectric constants that are relatively higher than silicon oxide (SiOx), such as hafnium oxide. The number of nanosheets 102 and HKMG 104 layers may differ (more layers or fewer layers) from the number depicted in the representative embodiment.

Figure 2A:
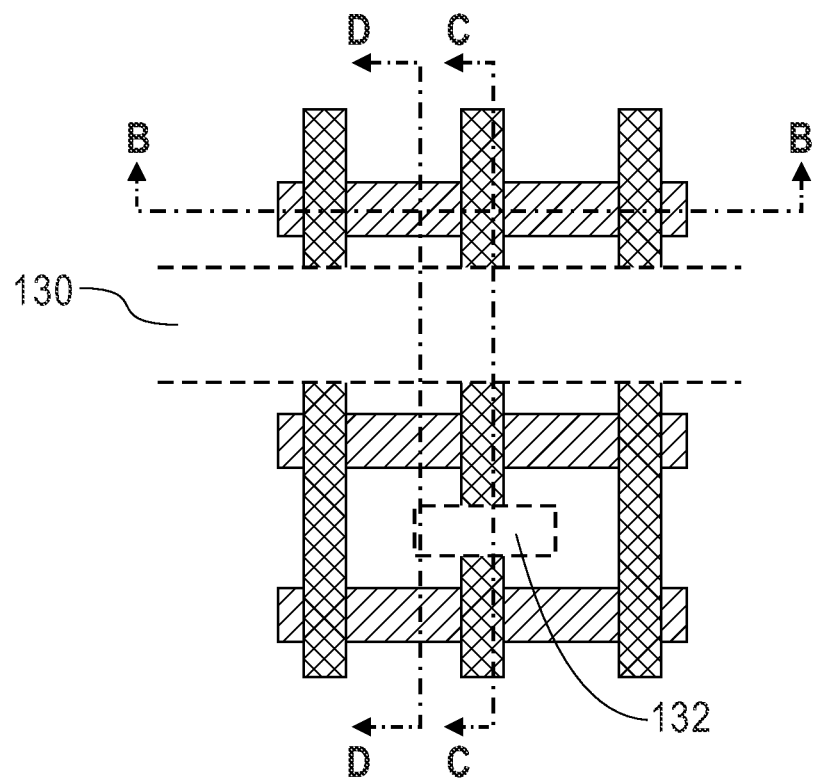
FIGS. 2A, 2B, 2C, and 2D depict the semiconductor structure 100 at a subsequent fabrication stage of the processing method, in accordance with one embodiment of the present invention.
Figure 2B:
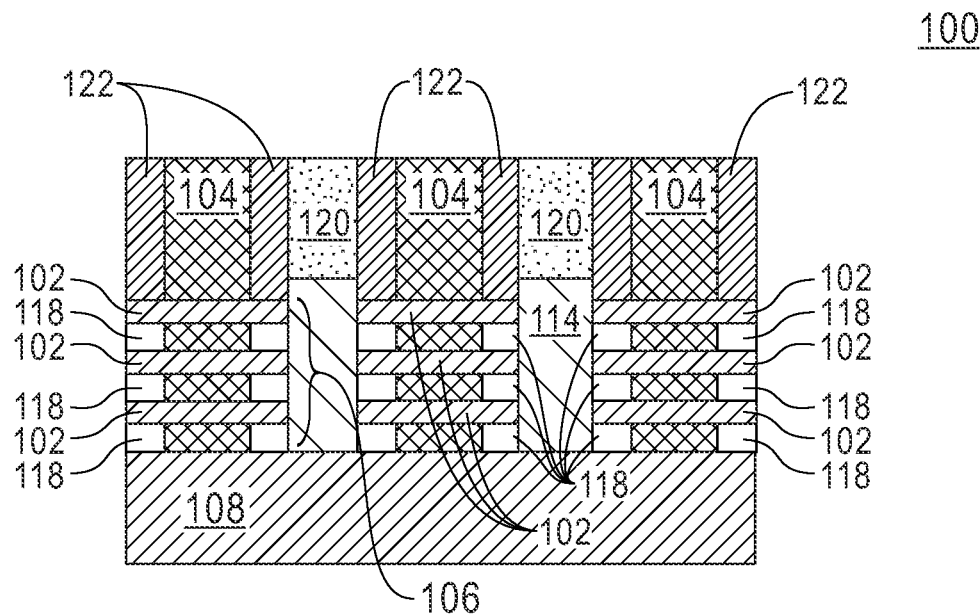
Figure 2C:
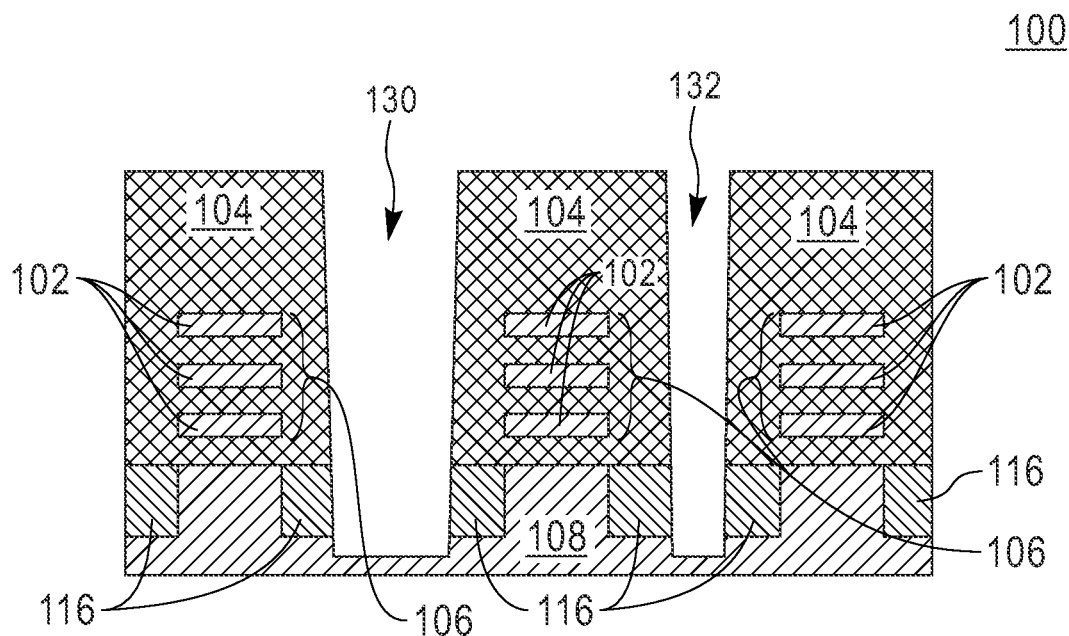
Figure 2D:
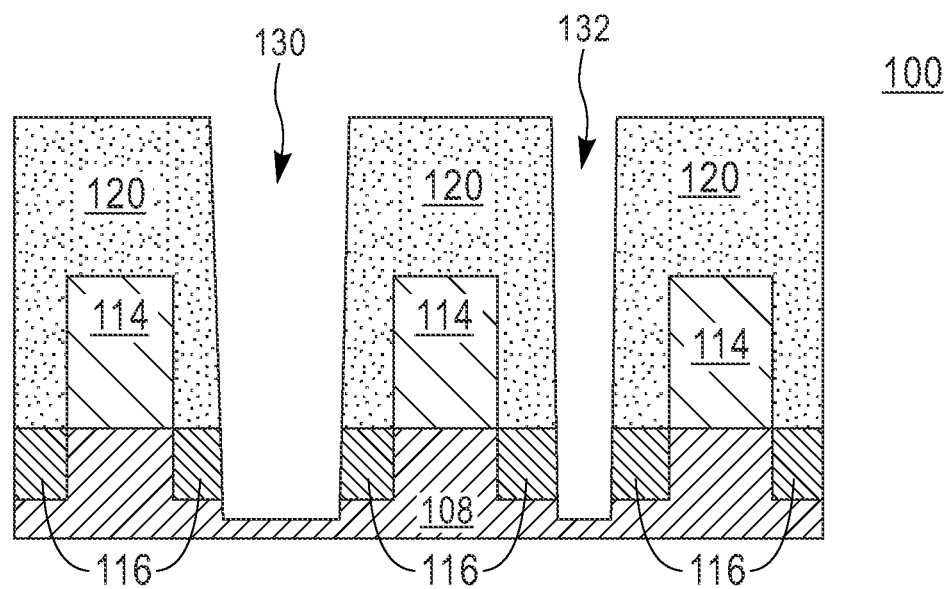

FIGS. 2A, 2B, 2C, and 2D depict the semiconductor structure 100 at a subsequent fabrication stage of the processing method, in accordance with one embodiment of the present invention. FIG. 2A depicts a top down view of the semiconductor structure 100, with FIGS. 2B, 2C, and 2D depicting cross-sectional side views at the locations indicated in FIG. 2A. These figures show a gate cut 130 that may be formed using a reactive ion etch (RIE). The gate cut 130 which is located at cell boundary (i.e., between NFET and NFET, or between PFET and PFET) is etched between the stacks 106, so that the nanosheets 102, inner spacers 118, and S/Ds 114 are unaffected. The gate cut 130 does, however, cut through the HKMG 104 outside of the stack 106, and cuts through the ILD 120, spacer 122, and optionally into or through the STI 116 to the substrate 108. The gate cut 130 may be approximately 25 to 70 nm meters, or typically around 30 nanometers in the y direction 112, but in the x direction the gate cut 130 may extend potentially through all the columns of the HKMG 104 of the semiconductor structure 100.

The semiconductor structure 100 also includes a narrow gate cut 132 that is narrower in the y direction 112 (e.g., 10 to 22 nm, or approximately 18 nanometers) and significantly shorter in the x direction 110. Specifically, as shown in FIG. 2A, the narrow gate cut 132 is located within a complementary metal-oxide-semiconductor (CMOS) cell (between NFET and PFET), it only etches one row or a few rows of HKMG 104, rather than forming a long trench line (or all of the rows of HKMG 104) that are etched by the gate cut 130. Gate cut 132 and 130 can be formed together in any known lithography and etch process.

Figure 3A:
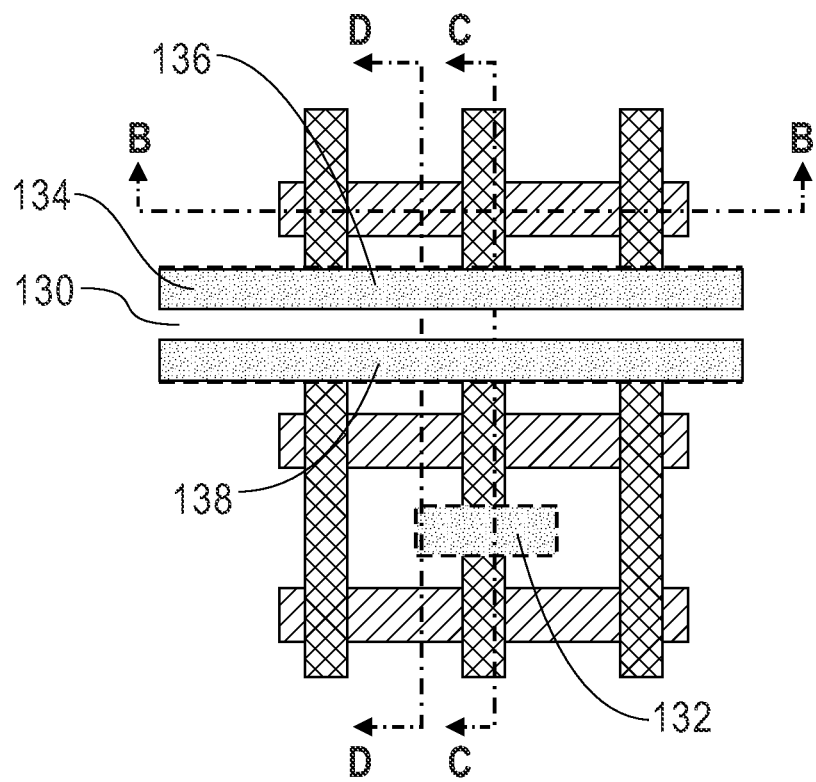
FIGS. 3A, 3B, 3C, and 3D depict the semiconductor structure 100 at a subsequent fabrication stage of the processing method, in accordance with one embodiment of the present invention.
Figure 3B:
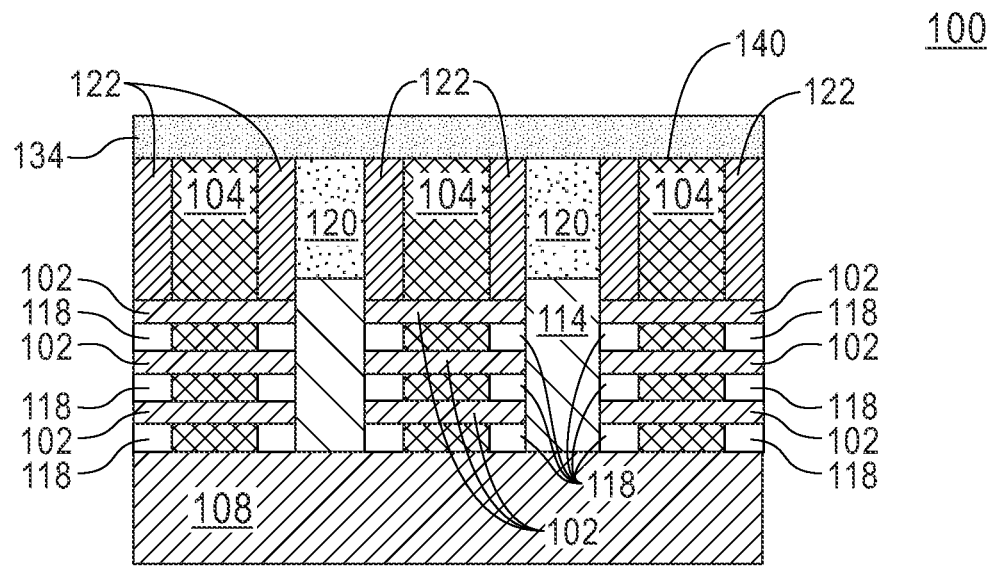
Figure 3C:
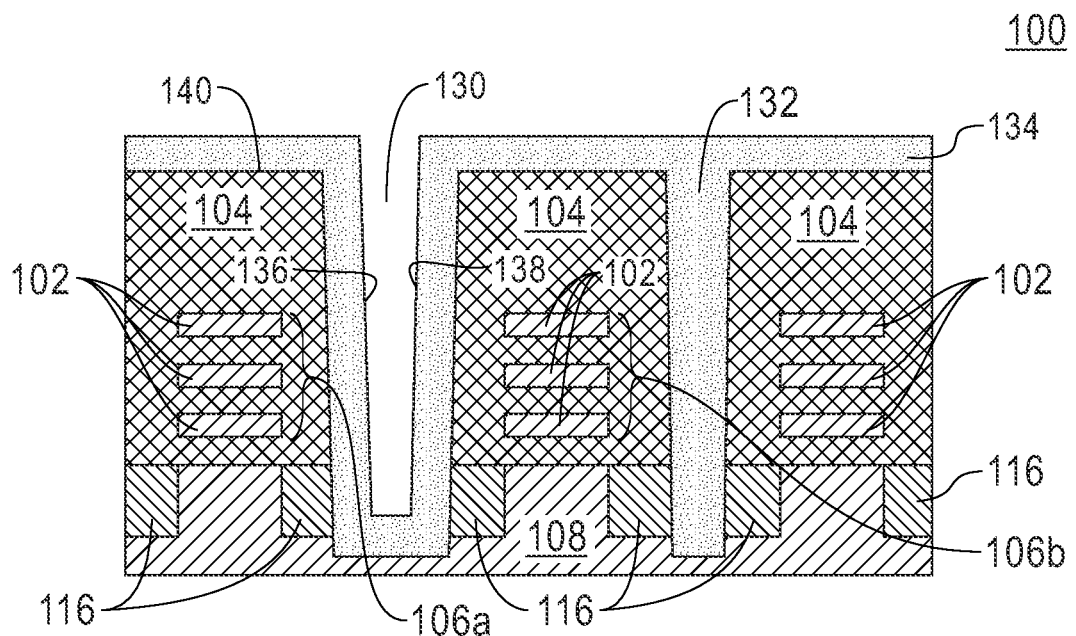
Figure 3D:
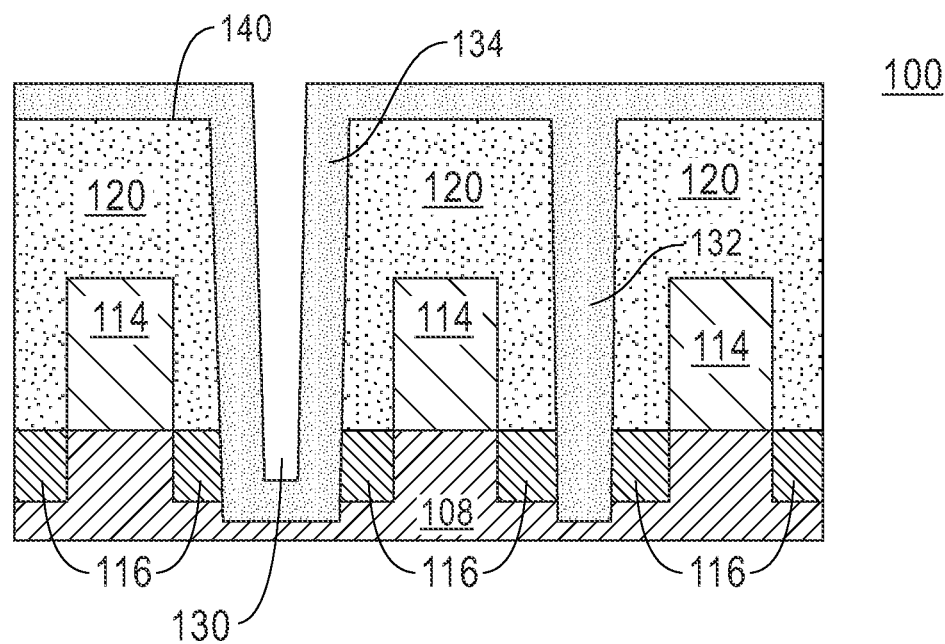

FIGS. 3A, 3B, 3C, and 3D depict the semiconductor structure 100 at a subsequent fabrication stage of the processing method, in accordance with one embodiment of the present invention. FIG. 3A depicts a top down view of the semiconductor structure 100, with FIGS. 3B, 3C, and 3D depicting cross-sectional side views at the locations indicated in FIG. 3A. These figures show a liner 134 lining the gate cut 130. The liner 134 is formed using a blanket deposition process whereby the exposed surfaces of the semiconductor structure 100 are lined with the liner 134. The exposed surfaces include a top surface 140 of the semiconductor structure 100, the gate cut 130, and the narrow gate cut 132. The liner 134 includes a first lateral side 136 and a second lateral side 138 within the gate cut 130. Within the narrow gate cut 132, however, the liner 134 from the lateral sides connects, so that the narrow gate cut 132 is fully filled with the material of the liner 134. The material of the first liner is different than ILD layer 120. For example, the liner 134 may include SiN, SiOC, SiC, SiBCN, SiOCN, AlOx, AlNx, etc. The thickness of the liner 134 ranges from 5 nm to 15 nm.

Figure 4A:
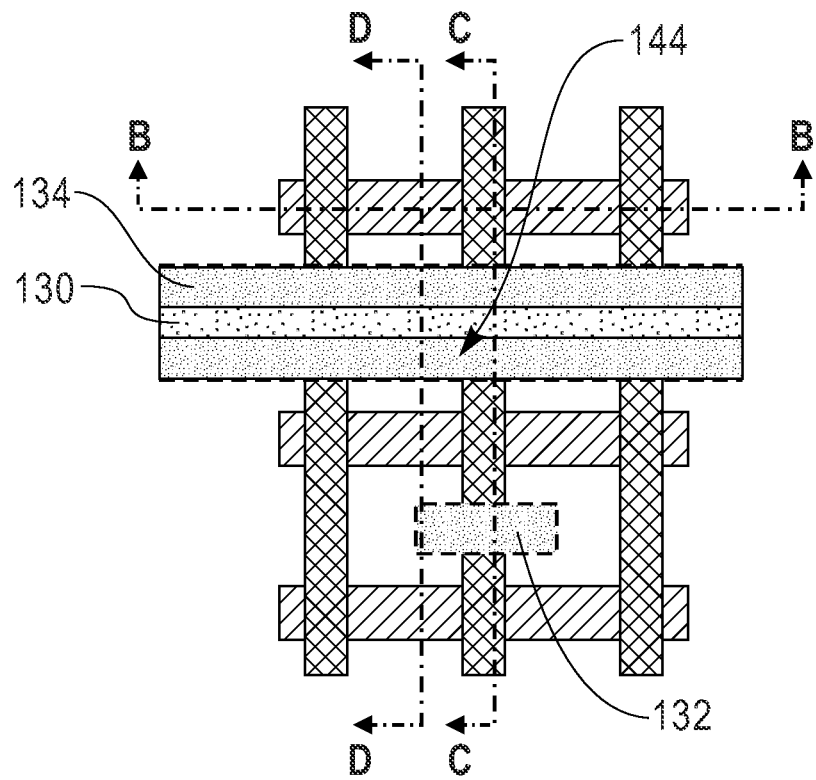
FIGS. 4A, 4B, 4C, and 4D depict the semiconductor structure 100 at a subsequent fabrication stage of the processing method, in accordance with one embodiment of the present invention.
Figure 4B:
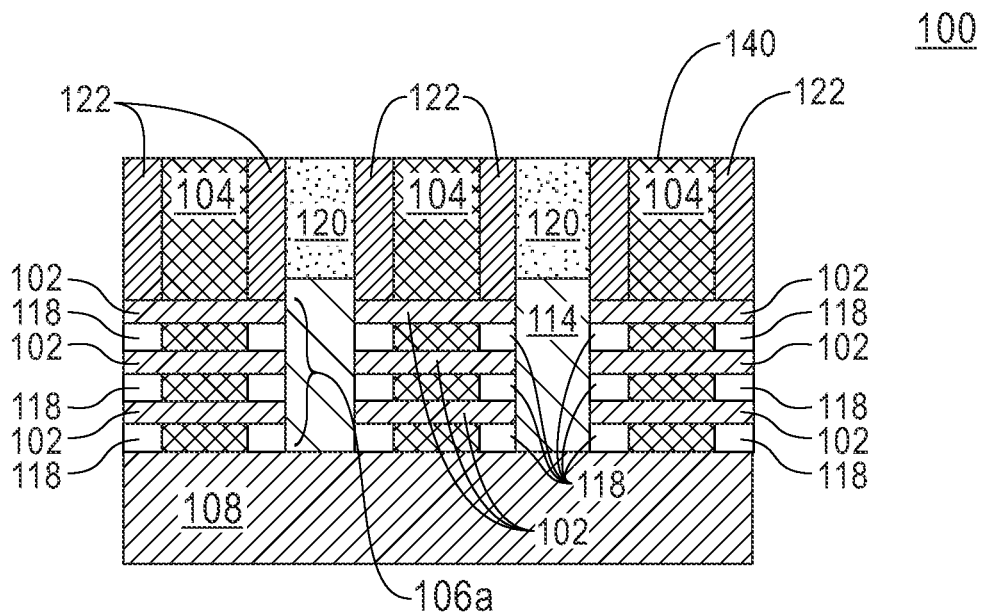
Figure 4C:
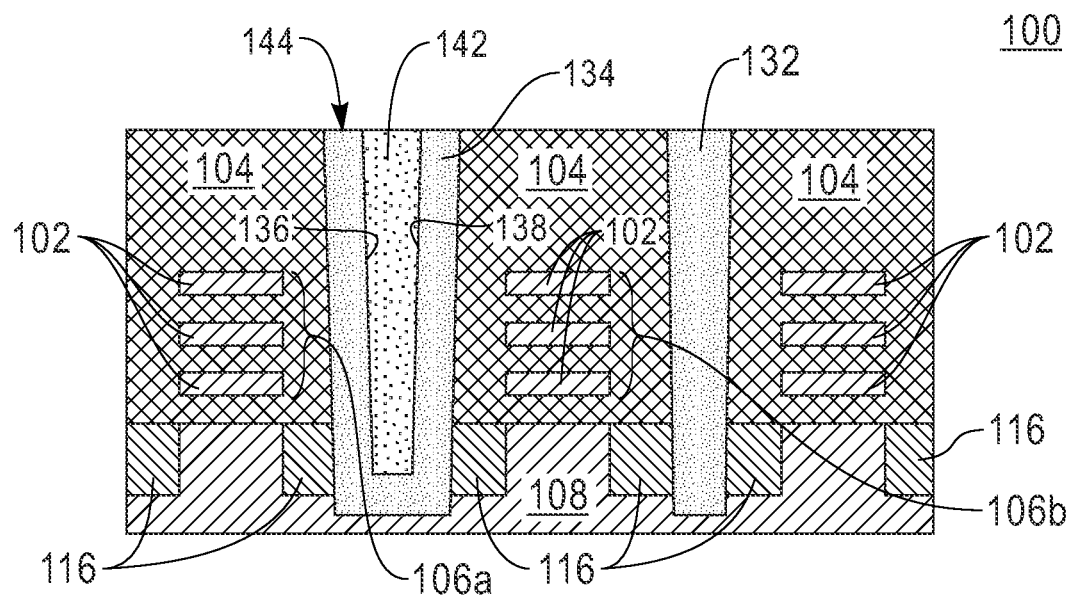
Figure 4D:
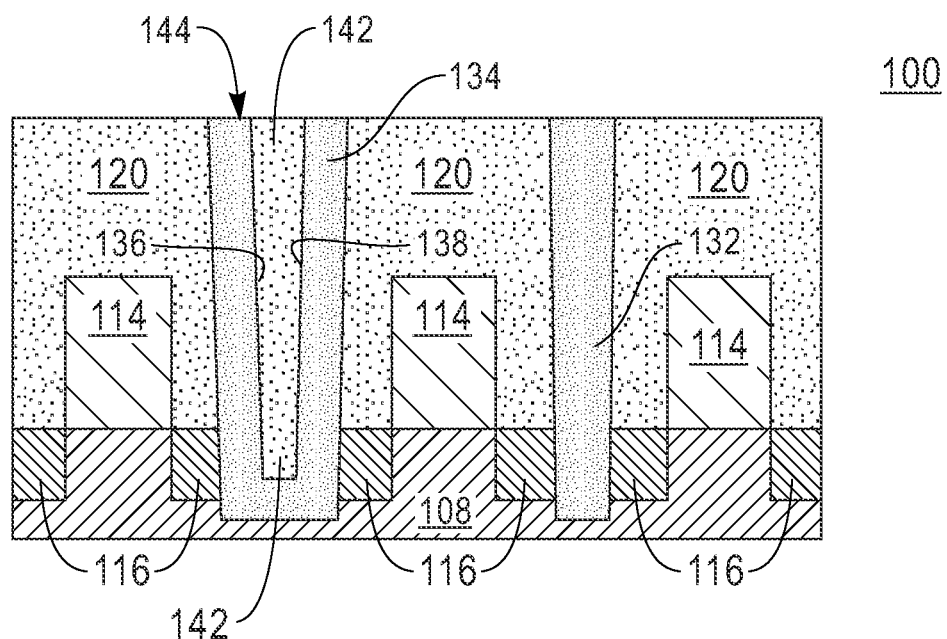

FIGS. 4A, 4B, 4C, and 4D depict the semiconductor structure 100 at a subsequent fabrication stage of the processing method, in accordance with one embodiment of the present invention. FIG. 4A depicts a top down view of the semiconductor structure 100, with FIGS. 4B, 4C, and 4D depicting cross-sectional side views at the locations indicated in FIG. 4A. These figures show a dielectric core 142 confined within the gate cut 130 between the first lateral side 136 and the second lateral side 138. The dielectric core 142 may be formed as a blanket structure of dielectric deposition followed by etch back or chemical-mechanical planarization (CMP). The liner 134 may also be planarized so that the top surface 140 including the HKMG 104 and the ILD 120 is exposed. The liner material could be with the same or similar material as ILD 120, such as SiO2. The liner 134 and dielectric core 142 together form a gate cut region 144 that insulates a first stack 106a from a second stack 106b, and enables accurate S/D contact position between the device with first stack 106a and a power rail, as explained in detail below.

Figure 5A:
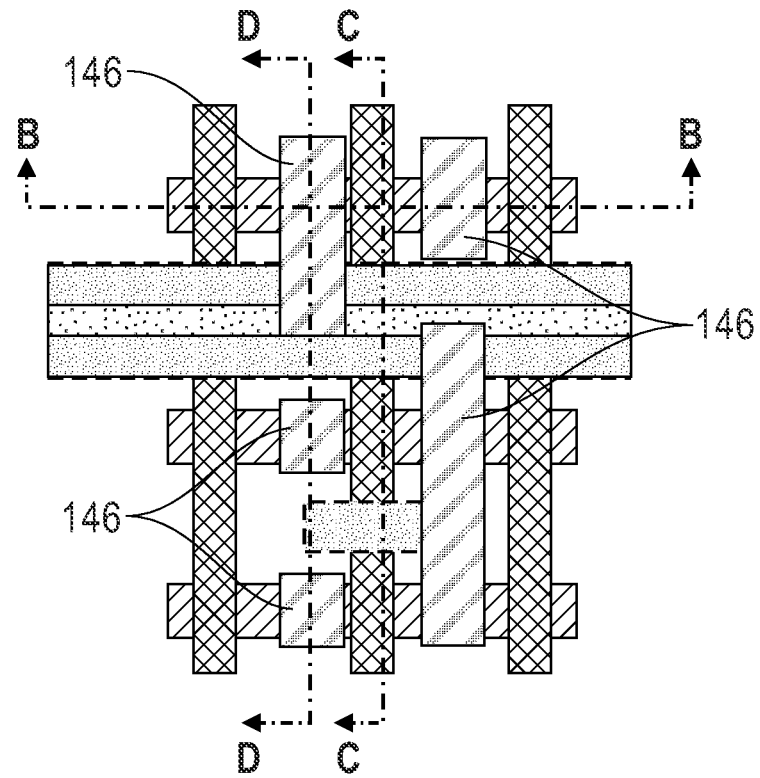
FIGS. 5A, 5B, 5C, and 5D depict the semiconductor structure 100 at a subsequent fabrication stage of the processing method, in accordance with one embodiment of the present invention.
Figure 5B:
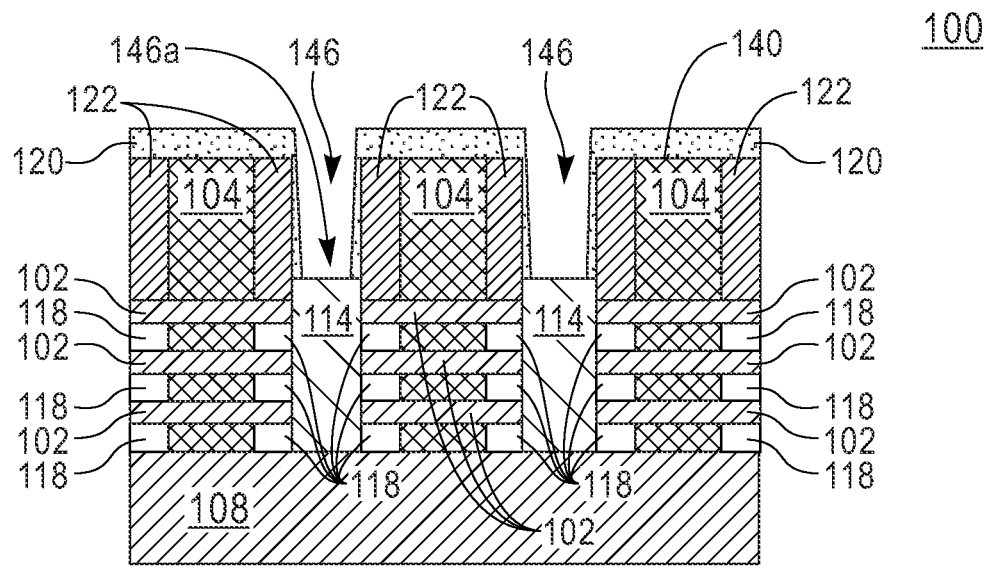
Figure 5C:
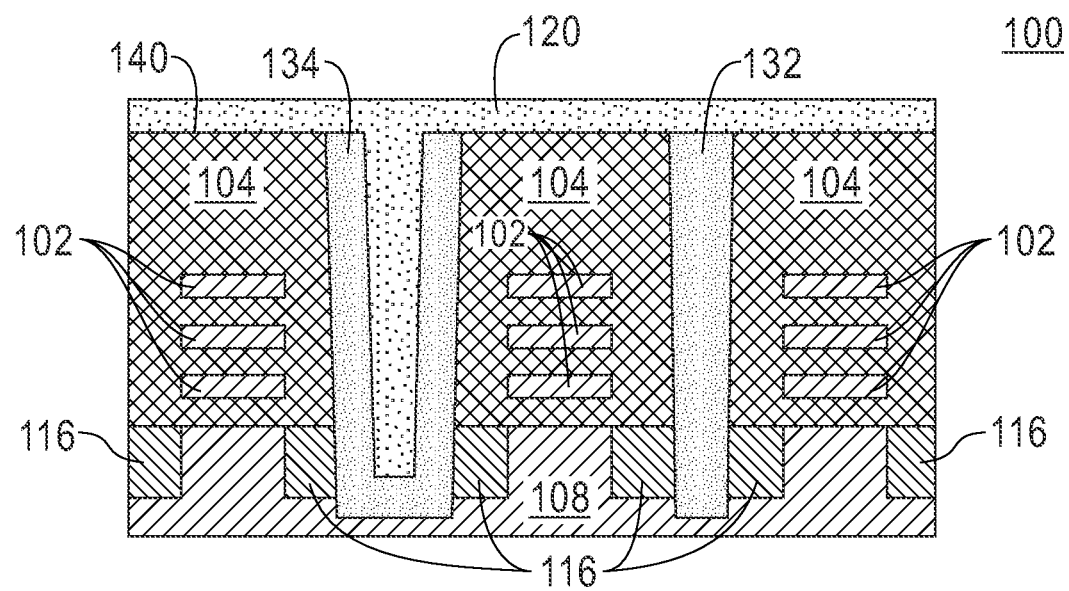
Figure 5D:
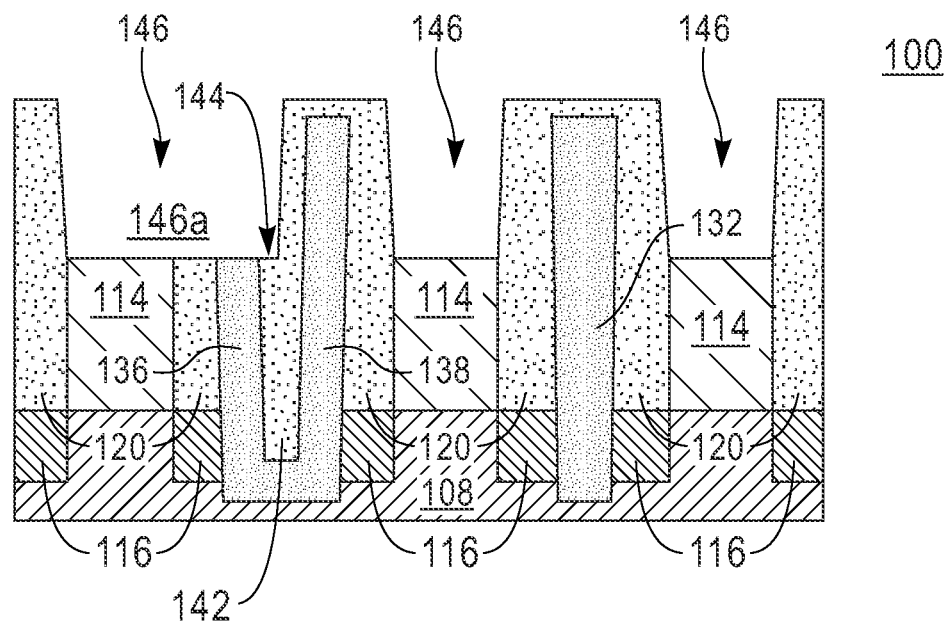

FIGS. 5A, 5B, 5C, and 5D depict the semiconductor structure 100 at a subsequent fabrication stage of the processing method, in accordance with one embodiment of the present invention. FIG. 5A depicts a top down view of the semiconductor structure 100, with FIGS. 5B, 5C, and 5D depicting cross-sectional side views at the locations indicated in FIG. 5A. These figures show after that additional ILD 120 deposition, source/drain (S/D) contact regions 146 are etched over the S/Ds 114 for that will eventually electrically connect the S/Ds 114 to upper level circuits using vias. A first S/D contact region 146a is cut through the first lateral side 136 and at least partially into the dielectric core 142 of the gate cut region 144. The S/D contact regions 146 may be formed/cut using a non-selective etch process, such as RIE, that etches the oxide of the ILD 120 and the liner 134.

Figure 6A:
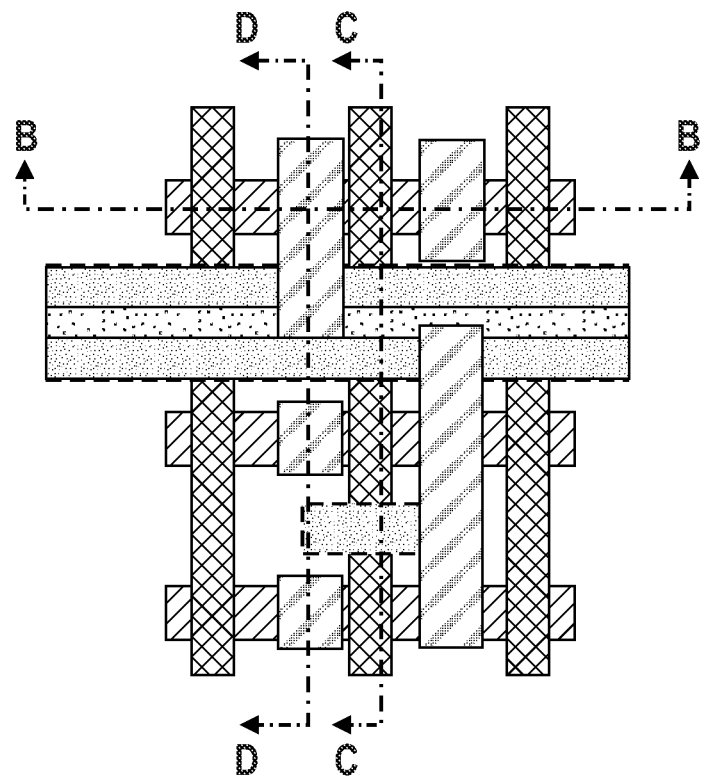
FIGS. 6A, 6B, 6C, and 6D depict the semiconductor structure 100 at a subsequent fabrication stage of the processing method, in accordance with one embodiment of the present invention.
Figure 6B:
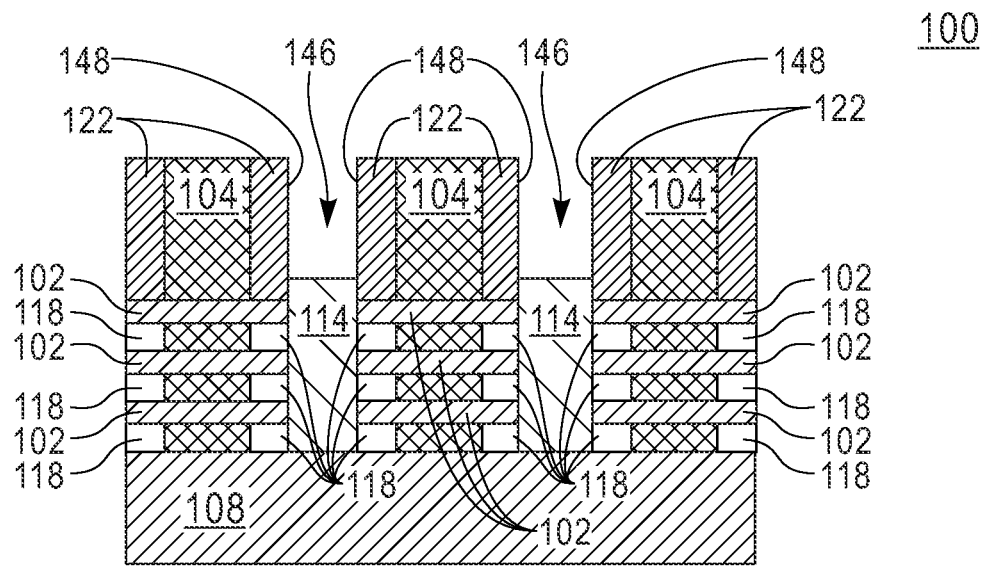
Figure 6C:
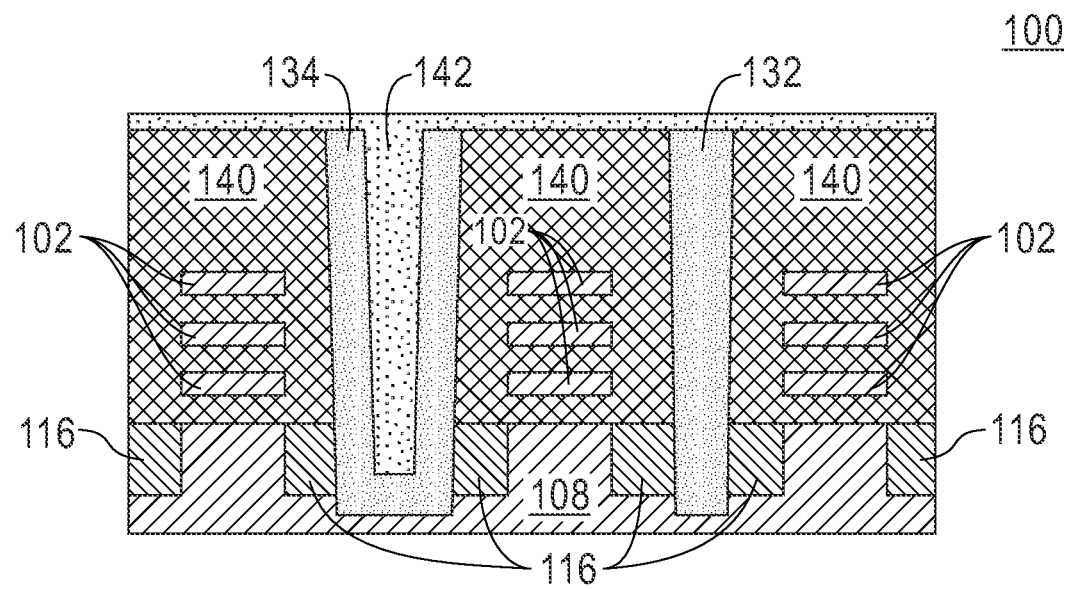
Figure 6D:
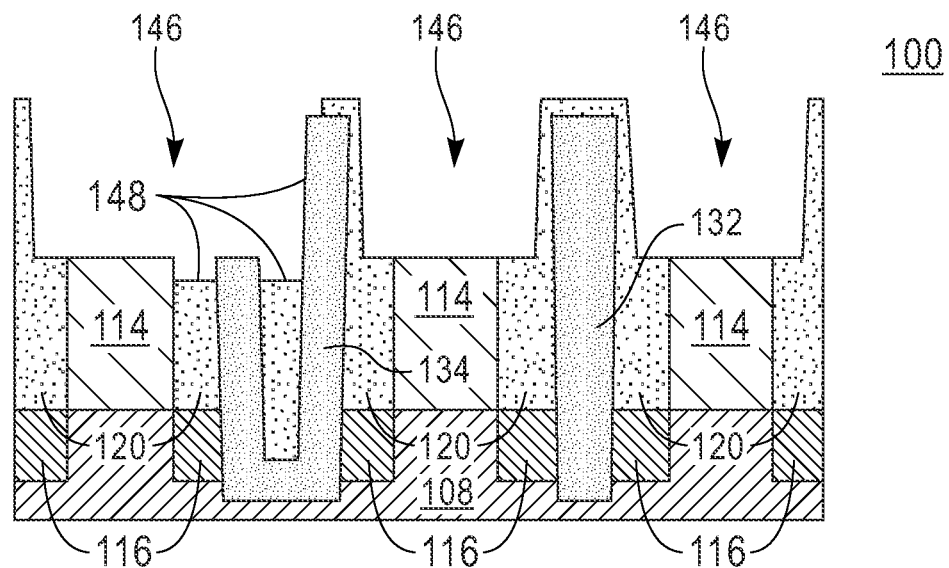

FIGS. 6A, 6B, 6C, and 6D depict the semiconductor structure 100 at a subsequent fabrication stage of the processing method, in accordance with one embodiment of the present invention. FIG. 6A depicts a top down view of the semiconductor structure 100, with FIGS. 6B, 6C, and 6D depicting cross-sectional side views at the locations indicated in FIG. 6A. These figures show a selective isotropic etch of the dielectric core 142 with respect to the liner 134. As used herein, the term "selective," in reference to a material removal process (e.g., etching), denotes that the material removal rate (i.e., etch rate) for the targeted material is greater than the removal rate for at least another material exposed to the material removal process, with an appropriate etchant choice. The etch process used to selectively etch the dielectric core 142 may include DHF or SiConi, which does not etch the liner 134, which could be made of SiN. Thus, in clean up regions 148 around a periphery of the S/D contact region 146, the dielectric core 142 is removed until the liner 134, the spacers 118, and the S/Ds 114 are exposed with no covering from the dielectric core 142 or ILD 120. This selective etch stopping over liner 134 means that the initial position of the S/D contact region 146 is not required to be very accurate, since the S/D contact region 146 will be precisely expanded to the liner 134 by lateral dielectric etch as long as the cut of the initial S/D contact 146 includes the dielectric core 142. The selective etch means that the lateral edge of the S/D contact region will always end at the second lateral side 138 of the liner 134. Additionally, as shown in FIG. 6D, a bottom edge of the clean up regions 148 is etched into the dielectric core 142 and the ILD 120 lower than a top edge of the first lateral side 136.

Figure 7A:
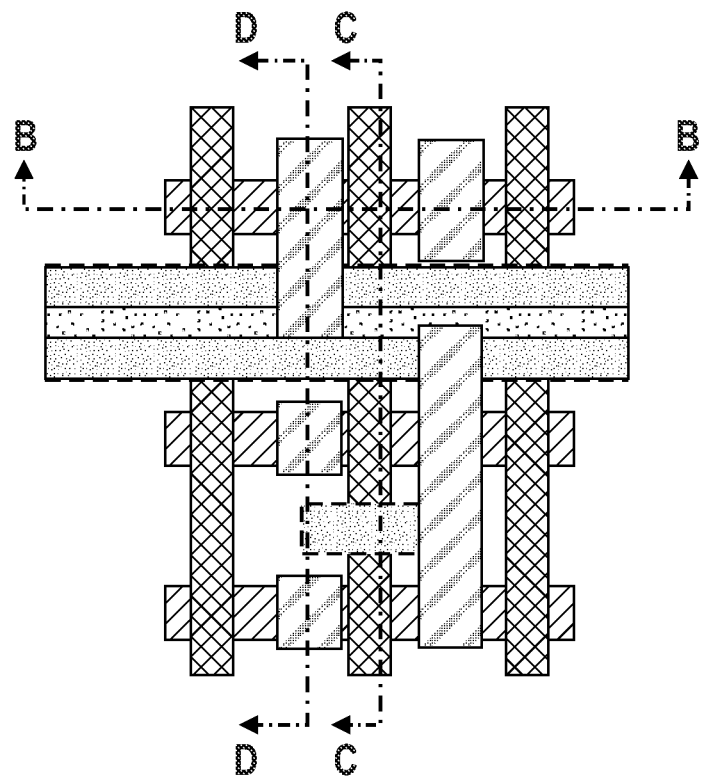
FIGS. 7A, 7B, 7C, and 7D depict the semiconductor structure 100 at a subsequent fabrication stage of the processing method, in accordance with one embodiment of the present invention.
Figure 7B:
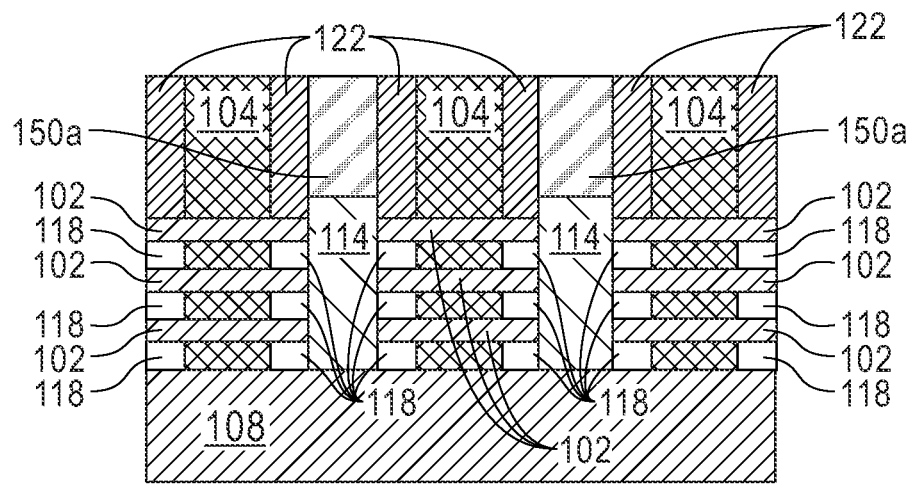
Figure 7C:
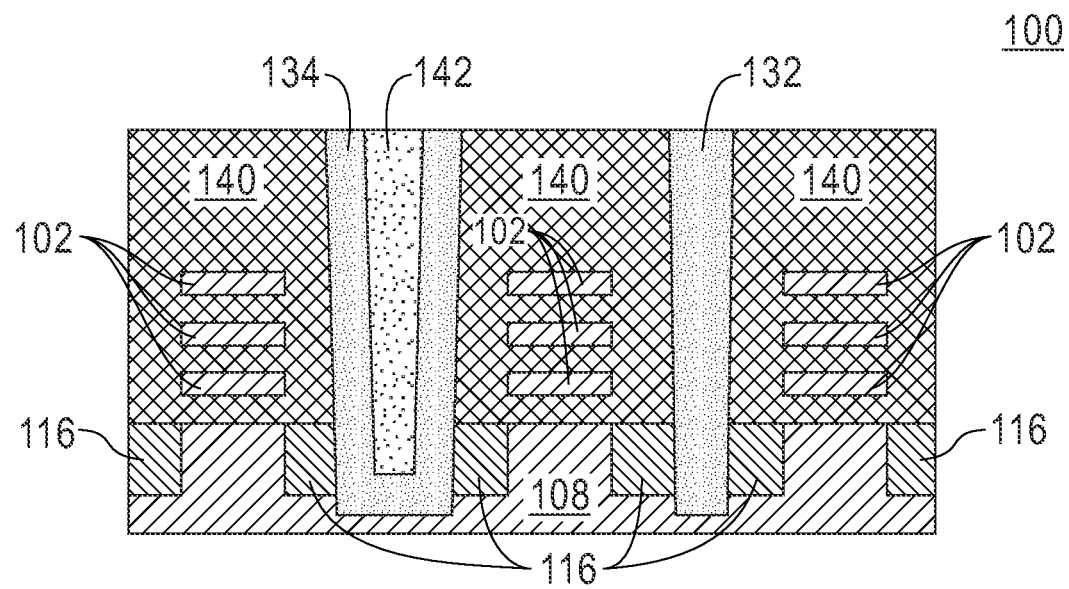
Figure 7D:
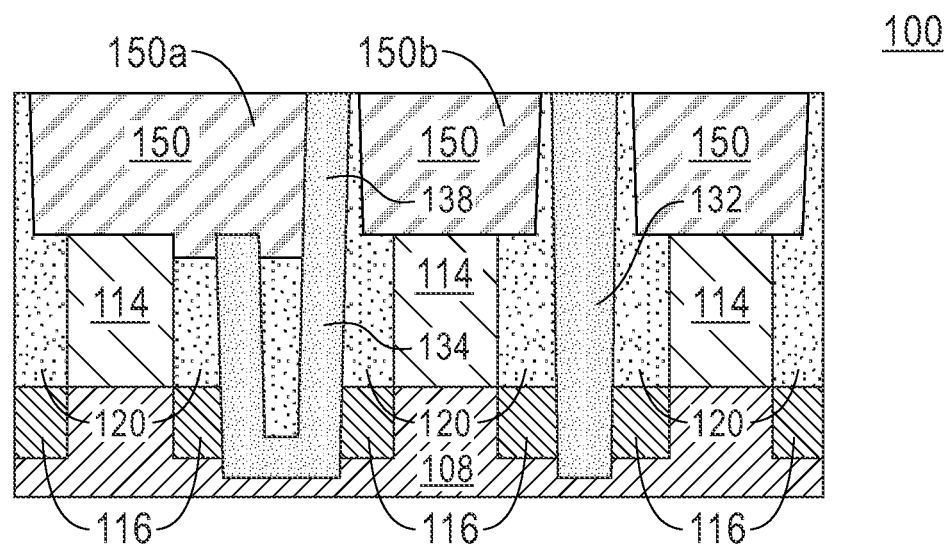

FIGS. 7A, 7B, 7C, and 7D depict the semiconductor structure 100 at a subsequent fabrication stage of the processing method, in accordance with one embodiment of the present invention. FIG. 7A depicts a top down view of the semiconductor structure 100, with FIGS. 7B, 7C, and 7D depicting cross-sectional side views at the locations indicated in FIG. 7A. These figures show source/drain (S/D) contacts 150 formed within the S/D contact regions 146. The S/D contacts 150 include a first S/D contact 150a that has a line-end 152 that contacts the second lateral side 138 of the liner 134. The first S/D contact 150a forms into the dielectric core 142 and the ILD 120 such that a bottom edge of the first S/D contact 150a is lower than a top edge of the first lateral side 136. The first S/D contact 150a thus laterally overlaps the first lateral side 136 and the dielectric core 142. The semiconductor structure 100 also includes a second S/D contact 150b located on an opposite side of the liner 134 from the first S/D contact 150a. The contact metals may include a silicide liner (e.g., Ti, Ni, NiPt), an adhesion metal liner such as TiN, and conductive metal fills, such as Co, W, Ru, etc. After metal deposition, and chemical-mechanical planarization (CMP) process is done to remove excessive metal and ILDs over the top surface of the gate.

Figure 8A:
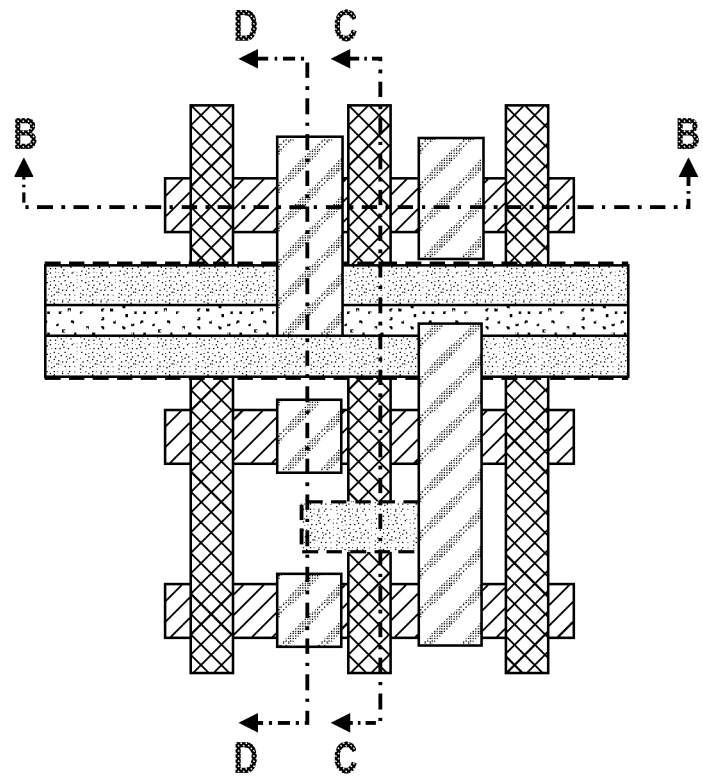
FIGS. 8A, 8B, 8C, and 8D depict the semiconductor structure 100 at a subsequent fabrication stage of the processing method, in accordance with one embodiment of the present invention.
Figure 8B:
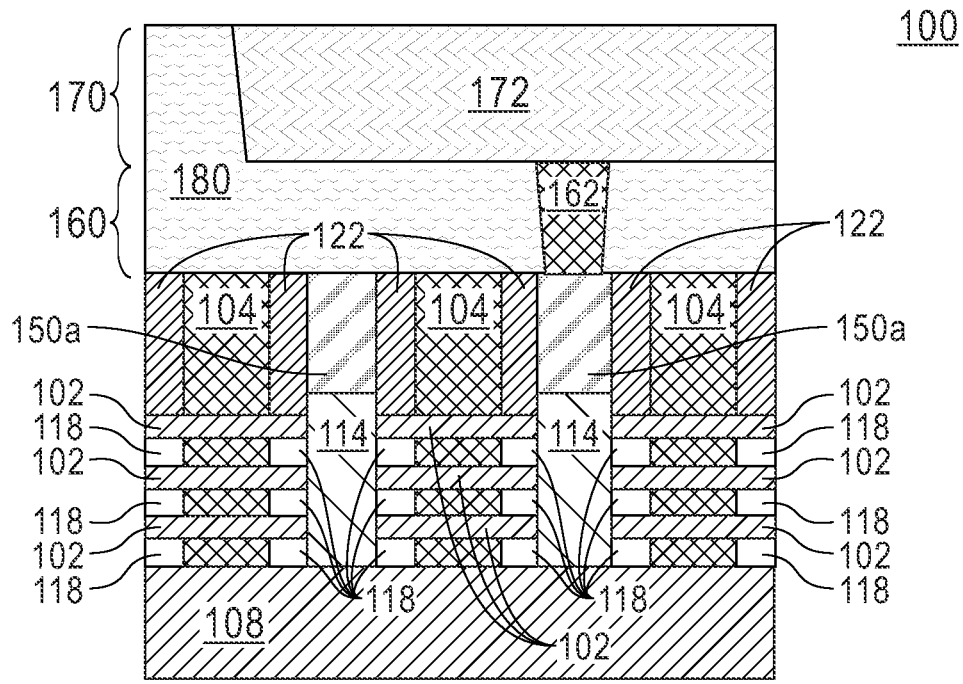
Figure 8C:
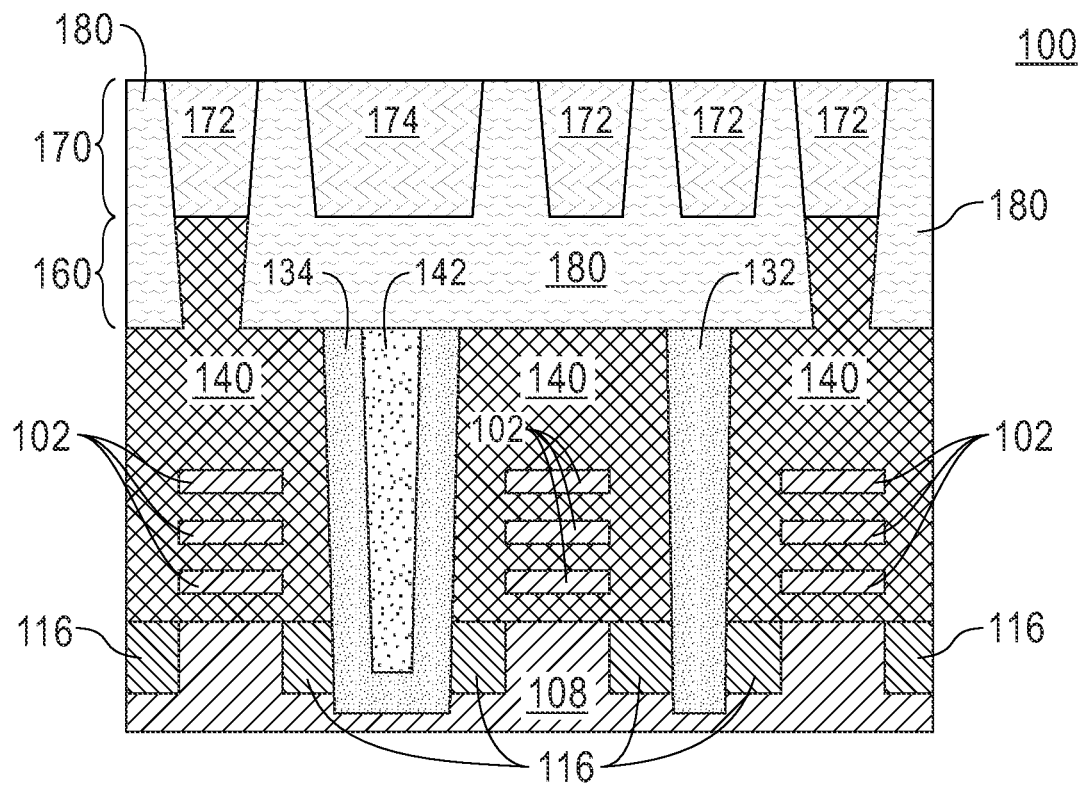
Figure 8D:
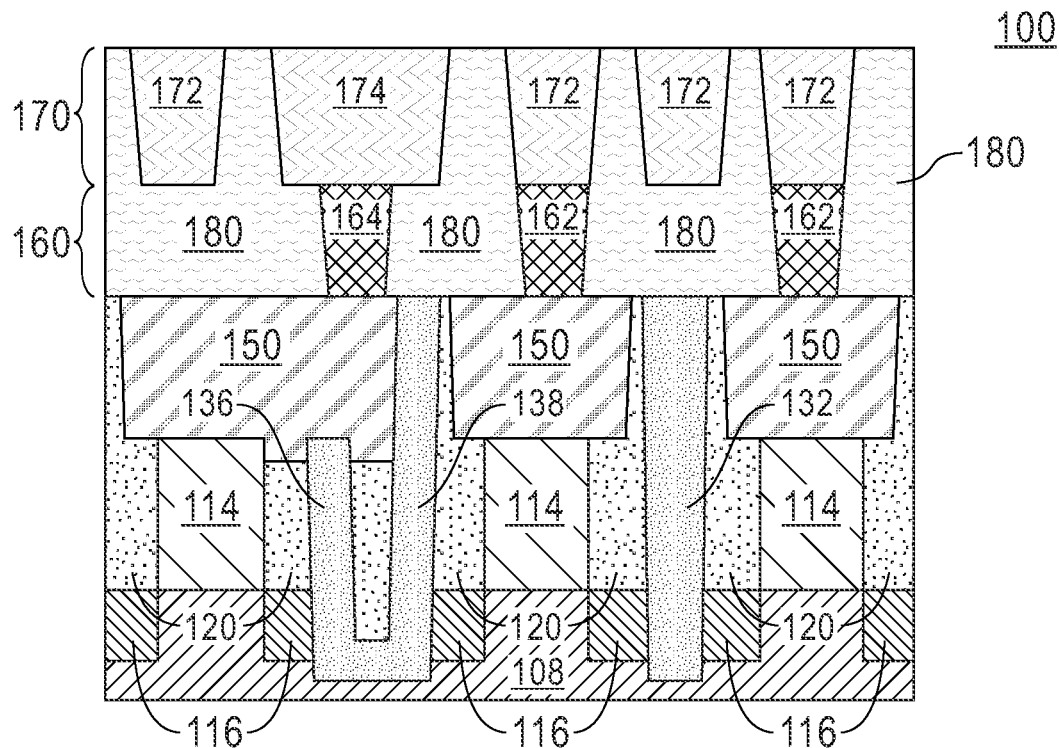

FIGS. 8A, 8B, 8C, and 8D depict the semiconductor structure 100 at a subsequent fabrication stage of the processing method, in accordance with one embodiment of the present invention. FIG. 8A depicts a top down view of the semiconductor structure 100, with FIGS. 8B, 8C, and 8D depicting cross-sectional side views at the locations indicated in FIG. 8A. These figures show a via level 160 and a first metal level 170 that connect the S/D contacts 150 to subsequent metal levels (not shown) of the semiconductor structure 100. The via level 160 includes: (i) signal vias 162 coupled between the S/D contacts 150 and signal rails 172 in the first metal level 170; and (ii) a power rail via 164 coupled between the first S/D contact 150a and a power rail 174 in the first metal level 170. Metal layer dielectric 180 surrounds the vias 162, 164 and the rails 172, 174 so that the vias 162, 164 and the rails 172, 174 remain insulated. The metal layer dielectric 180, the vias 162, 164, and the rails 172, 174 may be formed using known techniques of deposition, patterning, and etch. For example, the metal layer dielectric 180 may be formed, and then holes for the vias 162, 164 formed and filled with conductive material such as metal. Similar steps may be taken to form the rails 172, 174. Or both vias and metal lines can be formed first then forming metallization together using Cu dual damascene process.

Benefits of the disclosed embodiments include accurate positioning of the first S/D contact 150a and in particular the location of the line-end 152. That is, the line-end 152 is positioned so that the first S/D contact 150a has a robust electrical connection with the power rail via 164 but does not short to the second S/D contact 150b due to being too close. The liner 134 may also define a minimum insulator between contact 150a and 150b such that failures like shorts, breakdown, or leakage can be prevented by carefully choosing the material and thickness of liner 134. In embodiments without the liner 134, the line-end 152 may drift too close to the second S/D contact 150b due to lithographical misalignment, causing a short; or may drift too far from the second S/D contact 150b, causing the power rail via 164 to connect only to part of the first S/D contact 150a.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure for reducing contact to contact shorting, comprising:
   a gate cut region comprising:
     a liner; and
     a dielectric core confined within a first lateral side of the liner and a second lateral side of the liner, wherein the first lateral side contacts the second lateral side below the dielectric core; and
   a first source/drain (S/D) contact overlapping the first lateral side and the dielectric core, wherein the first S/D contact comprises a line-end that terminates within and only contacts the second lateral side of the liner.

2. The semiconductor structure of claim 1 wherein the first S/D contact is electrically connected between a first source/drain and a power rail via.

3. The semiconductor structure of claim 2, wherein the first source/drain comprises a selection from the group consisting of a PFET and an NFET.

4. The semiconductor structure of claim 1, wherein the liner comprises a liner material that is etch selective against dilute hydrofluoric acid (DHF) and the dielectric core comprises a core material that is etched by DHF.

5. The semiconductor structure of claim 1, comprising a second source/drain contact electrically connected between a second source/drain and a signal rail, wherein the second source/drain contact is located on an opposite side of the liner from the first source/drain contact.

6. The semiconductor structure of claim 1, wherein a vertical dimension of the gate cut region extends from a shallow trench isolation to a top surface of the first S/D contact.

7. The semiconductor structure of claim 1, wherein the gate cut region is located at a cell boundary selected from a group consisting of: a boundary between two NFETs and a boundary between two PFETs.

8. The semiconductor structure of claim 1, comprising a gate cut region, wherein the gate cut region is located at a boundary between a PFET and an NFET and comprises a same material as the liner.

9. The semiconductor structure of claim 1, wherein a bottom edge of the first S/D contact is lower than a top edge of the first lateral side.

10. A semiconductor structure, comprising:
    a first source/drain (S/D) contact electrically connected between a first source/drain (S/D) and a power rail;
    a second S/D contact electrically connected between a second S/D and a signal rail;
    a gate cut region between the first S/D contact and the second S/D contact, wherein the gate cut region comprises a liner, and a dielectric core contacting the first S/D contact, wherein the liner insulates the dielectric core from a high-metal gate, and the dielectric core is located at a vertical level between the first S/D and the second S/D.

11. The semiconductor structure of claim 10, comprising an interlayer dielectric (ILD) between the gate cut region and the second S/D contact.

12. The semiconductor structure of claim 10, wherein the first S/D comprises a selection from the group consisting of a PFET and an NFET.

13. The semiconductor structure of claim 10, wherein the liner comprises a liner material that is resistant to dilute hydrofluoric acid (DHF) and the dielectric core comprises a core material that is etched by DHF.

14. The semiconductor structure of claim 10, comprising a n gate cut region, wherein the n gate cut region is located at a boundary between a PFET and an NFET and comprises a same material as the liner.

15. The semiconductor structure of claim 10, wherein the gate cut region is located at a cell boundary selected from a group consisting of: a boundary between two NFETs and a boundary between two PFETs.

* * * * *